United States Patent [19]
McPartland

[11] Patent Number: 6,084,804
[45] Date of Patent: Jul. 4, 2000

[54] MEMORY ROW DRIVER WITH PARASITIC DIODE PULL-DOWN FUNCTION

[75] Inventor: Richard Joseph McPartland, Nazareth, Pa.

[73] Assignee: Lucent Technologies Inc., Murray Hill, N.J.

[21] Appl. No.: 09/304,888

[22] Filed: May 4, 1999

[51] Int. Cl.[7] ........................................... G11C 7/00
[52] U.S. Cl. .................. 365/189.11; 365/230.06
[58] Field of Search .................... 365/159.01, 189.11, 365/230.01, 230.06, 230.03

[56] References Cited

U.S. PATENT DOCUMENTS

| | | | |
|---|---|---|---|
| 5,477,489 | 12/1995 | Wiedmann | 365/189.04 |
| 5,572,461 | 11/1996 | Gonzalez | 365/156 |
| 5,835,402 | 11/1998 | Rao et al. | 365/149 |
| 5,949,712 | 9/1999 | Rao et al. | 365/185.07 |

*Primary Examiner*—Viet Q. Nguyen
*Attorney, Agent, or Firm*—Duane, Morris & Heckscher LLP

[57] ABSTRACT

An integrated circuit memory array has a plurality of rows of memory cells, each row of memory cells being coupled to a respective row line for enabling the memory cells of the row. A row driver of the memory array provides a row voltage on the row line. A pull-up transistor of the row driver pulls up the row voltage in response to a row control signal. A parasitic diode of the pull-up transistor is coupled at its anode to the row line and is adapted to pull the row voltage down from a high state voltage to a diode drop voltage plus a low state voltage in response an enable block signal coupled to the cathode of the parasitic diode. A pull-down transistor of the row driver also pulls down the row voltage in response to the row control signal.

18 Claims, 6 Drawing Sheets

MEMORY ROW DRIVER WITH PARASITIC DIODE PULL-DOWN FUNCTION

BACKGROUND OF THE INVENTION

1. Field of the Invention

The present invention relates to memory devices and, in particular, to the row pull-down function of row drivers used with rows of memory cell arrays.

2. Description of the Related Art

Computer memory cells are in wide use today. Each memory cell stores a bit of data, i.e. a logic-0 or logic-1, sometimes referred to as low or high, respectively, corresponding to the low voltage state (typically $V_{ss}$, e.g. ground= 0V)) or the high voltage state (typically $V_{DD}$, e.g. 3V). New data may be written into the cell, and stored data may be read from the cell. This is typically done by "enabling" the cell by providing a control signal to a control input terminal, which allows data in the cell to be read out on a second, data terminal (or data provided on the data terminal is written in the cell in a write operation).

An array of memory cells are typically provided in a memory array architecture. In a memory cell array, each row of memory cells is typically used to provide storage of larger, multi-bit units of data such as bytes or words. The memory array provides a number of rows or words to provide multiple word storage.

Memory arrays can be implemented in various forms, including Flash EEPROM, DRAM, ROM, and SRAM. Memory arrays are increasingly used in circuits (ICs) in devices such as cellular telephones, answering machines, cordless phones, and other applications. Memory used in ICs in such applications is sometimes referred to as embedded memory. Such applications often require a large amount of memory with fast cycle times. These applications also require the embedded memory circuits to be as physically small as possible to reduce manufacturing costs.

Address information received from a system processor by memory control logic is used by the row decoder of the memory control logic to generate a row control signal which is used to activate the desired row. To activate memory cells of a given row, the "row voltage" (the voltage of a row line coupled to the row control inputs of the memory cells) is raised from low to high (the row line is charged). To deactivate the memory cells, the row voltage is lowered (the row line is discharged). Activating a memory cell enables it to read (or write) data bits which are provided from or to the data columns of the memory cell array, which are coupled via data lines of a data bus to the processor.

Because of capacitance associated with the row line, the row control signal generated by memory control logic is typically not powerful enough to raise and lower the row voltage in sufficient time. Thus, row drivers are typically used for this purpose. The row driver receives the row control signal and then drives the memory cells with a corresponding row driver signal. For example, when the row control signal goes low (logic-0) to enable or activate the row, the row driver, which acts as an inverter, provides a high (logic-1) row driver signal, which feeds into the row control inputs of several memory cells of the row, to enable a write or read of the memory cell with data provided on the data column lines. The row control signal may carry either an "enable" or "disable" row control signal, i.e. it may switch to low (an "enable" signal) to enable or activate the row, and may switch to high (a "disable" signal) to disable or deactivate the row.

Figure 1:
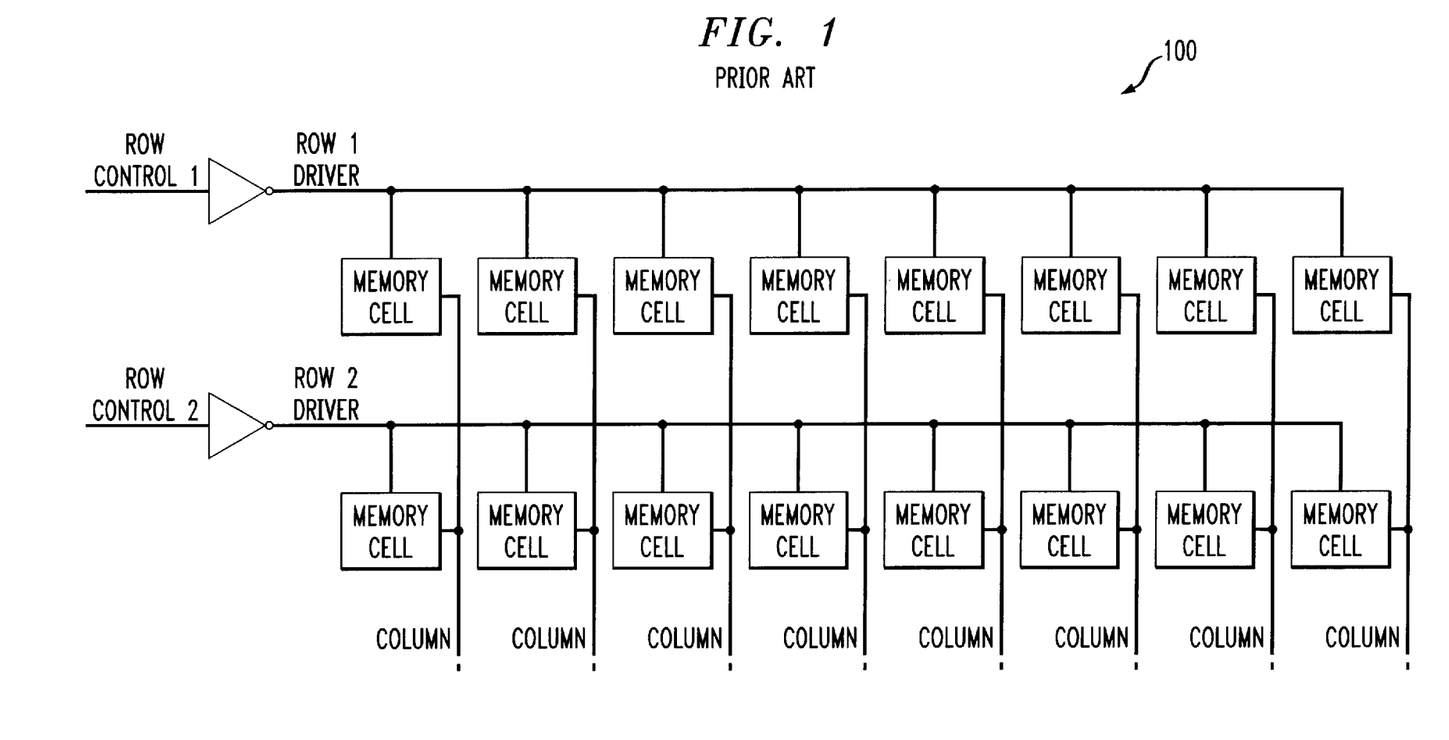
FIG. 1 is a block diagram illustrating a prior art continuous row memory array.

In a continuous row (non-segmented) memory array, a single row signal drives each memory cell of the entire row. A prior art continuous row memory array 100 is illustrated in FIG. 1. In a segmented row memory array architecture, which is often used with long, continuous rows of memory cells, each row is divided into sub-rows or local rows. A prior art segmented row memory array 200 is illustrated in FIG. 2.

Figure 2:
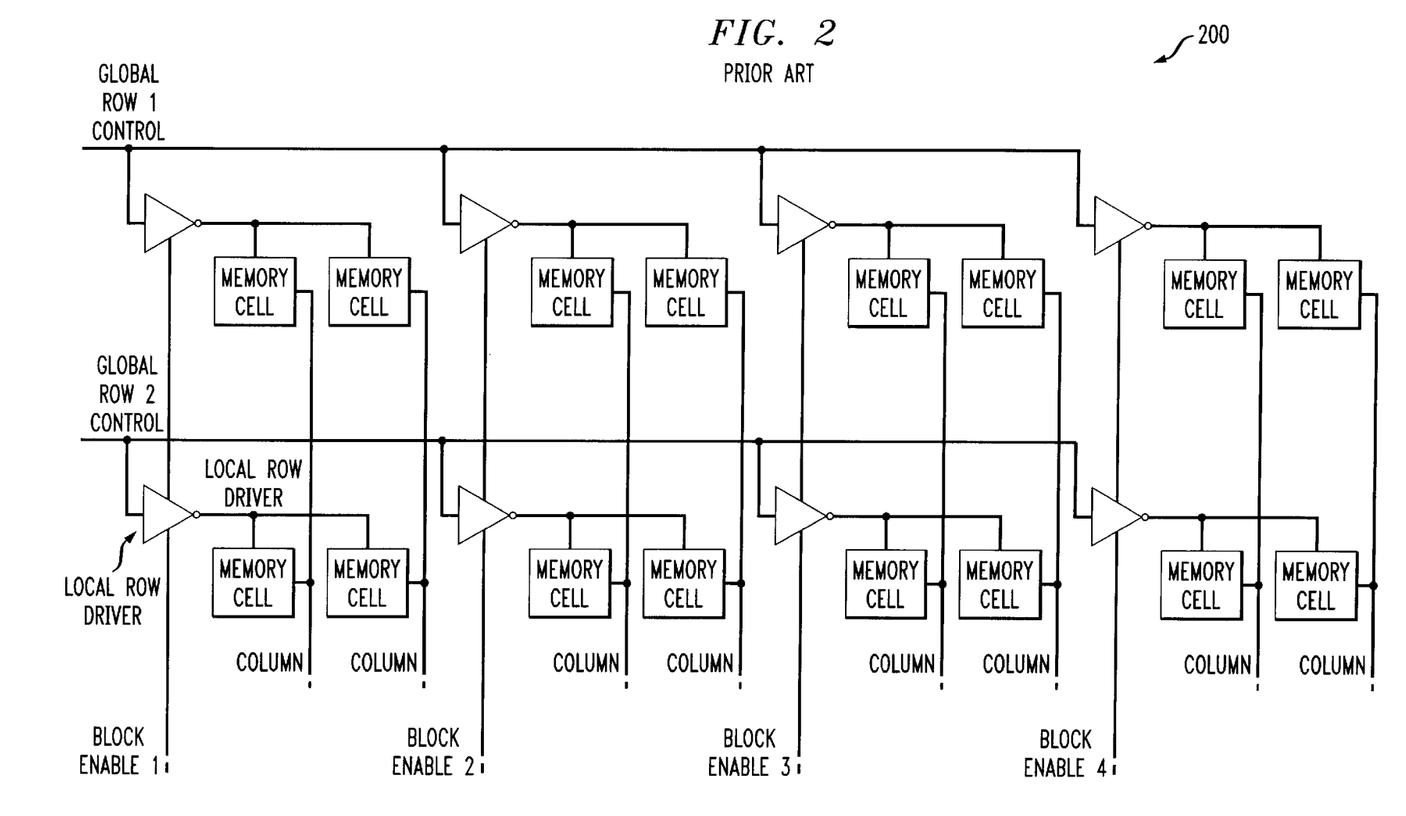
FIG. 2 is a block diagram illustrating a prior art segmented row memory array.

For example, FIG. 2 shows each row divided into local rows having two memory cells each. (Typically, each local row would have more than two memory cells, for example 128 memory cells.) In this case, the row control signal is used as a global row control signal which is fed into the input of several local row drivers of the row, one for each of several local rows of the row. Each local row driver provides a local row driver signal to the memory cells of the respective local row. Block enable signals are typically used for each local row as well as corresponding local rows of other rows. Each local row can thus be enabled by a combination of activation of the corresponding global row signal for that row plus the activation of the block enable for that local row. Local rows "above" each other in the array typically share the same block enable signal. Thus, to enable the memory cells of a given local row, both its global row control signal is activated (switched to low), and the block enable signal for the local row is activated (switched to high), which causes the local row driver signal for the local row to switch to high.

The row driver must be able to quickly charge the row line to bring it from low to high at the beginning of a memory cell access cycle, and must be able to quickly discharge the row line to pull it from high to low at the end of the memory cell access cycle so that the column data lines can be precharged for the next read cycle, for example. The row driver must therefore be powerful enough to quickly charge and discharge the row line, so that a fast memory access cycle time can be achieved.

Figure 3A:
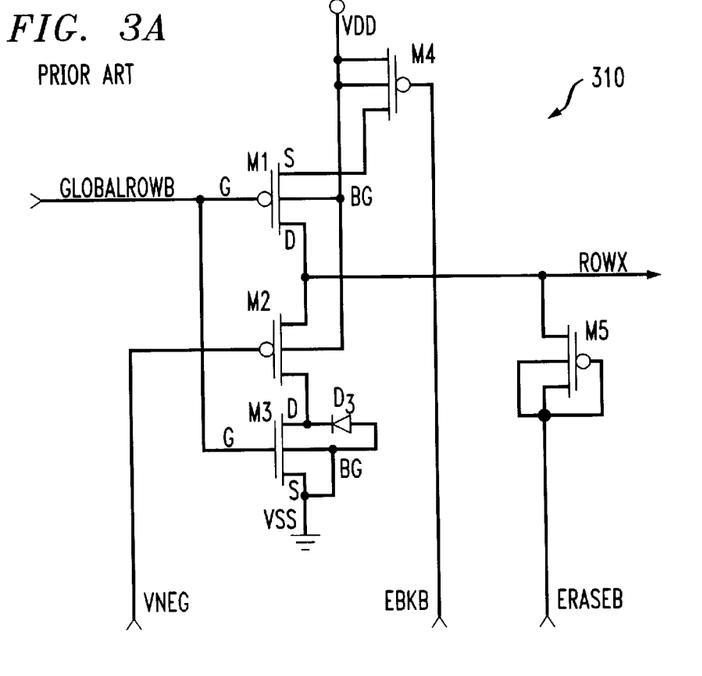
FIGS. 3A,B, are circuit diagrams illustrating prior art non-triple-well and triple-well row driver circuits, respectively, used in the memory arrays of FIG. 1 and 2.
Figure 3B:
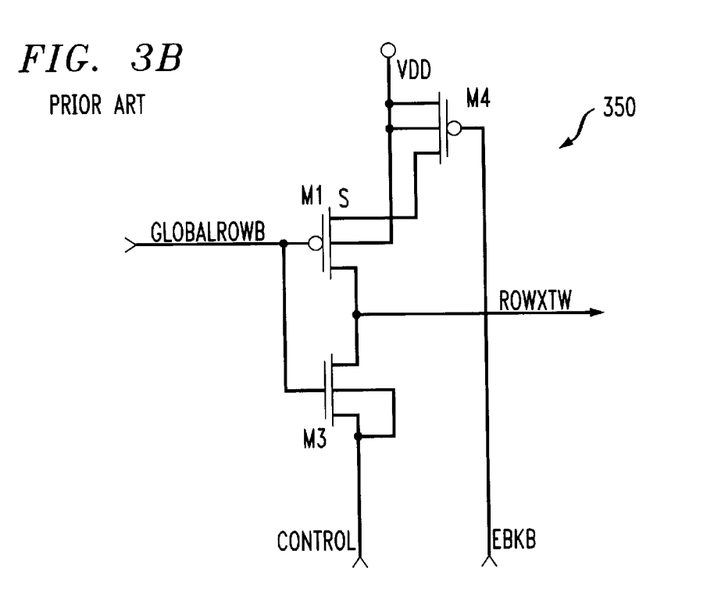

Referring now to FIGS. 3A,B, there are illustrated prior art row driver circuits 310, 350. Transistors illustrated with a bubble on the gate line indicate a pmos or p-channel transistor; nmos or n-channel transistors are illustrated without such a bubble.

Each row driver 310, 350 may be used, for example, for the row drivers in segmented row memory array 200 to drive the two memory cells of a local row with the local row driver signal ROWX. Each row driver 310, 350, receives as an input the global row signal GLOBALROWB (i.e., global row 1 or global row 2 of FIG. 2) and the enable block signal EBKB for the local row. In the nomenclature used in the present application, the letter "B" at the end of a signal term (e.g., EBKB or GLOBALROWB) indicates "bar" or inverse, to indicate that the signal is active when it is in the low state.

In both row drivers 310 and 350, transistor M4 is a block selection transistor, transistor M1 is the pull-up transistor which pulls the ROWX or ROWXTW signal up to high at the beginning of a memory access cycle, and transistor M3 is the n-channel pull-down transistor which pulls the ROWX or ROWXTW down to low at the end of a memory access cycle. In row driver 310, transistor M3 is a non-triple-well CMOS process n-channel transistor. In row driver 350, transistor M3 is a triple-well CMOS process n-channel transistor.

Figure 4A:
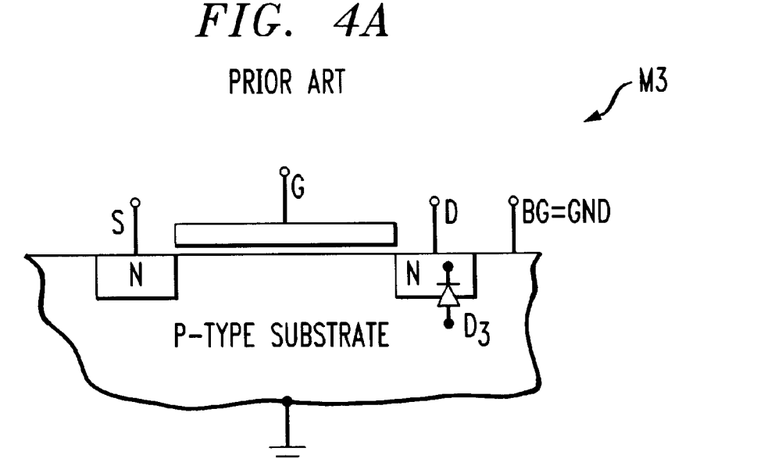
FIGS. 4A,B are cross-sectional views illustrating the terminals, parasitic diode, and substrate of the n-channel pull-down transistor of the row drivers of FIGS. 4A,B, respectively.

Referring now to FIGS. 4A,B, there are shown cross-sectional views illustrating the terminals (S, G, D, BG), parasitic diode $D_3$, and substrate of the n-channel pull-down transistor M3 of row drivers 310, 350 of FIGS. 3A,B, respectively. The pull-down transistor M3 of row driver 310 contains a parasitic drain diode D3 between the p-type substrate (and backgate terminal BG) and n-type drain region D of n-channel pull-down transistor M3. The triple-well pull-down transistor M3 of row driver 350 contains a parasitic drain diode D3 between the p-type tub or well (and backgate terminal BG) and n-type drain region D of n-channel pull-down transistor M3.

Referring once more to FIGS. 3A,B, row driver circuit 310 comprises transistors M1, M2, M3, M4, and M5, coupled to signal lines GLOBALROWB, VNEG, EBKB, ERASEB, and ROWX, and to $V_{DD}$ and ground terminals, as shown. Row driver circuit 310 is for use with a Flash EEPROM memory. N-channel pull-down transistor M3 is situated directly in the p-type substrate of the silicon wafer.

Transistor M5 is used to pull ROWX negative when erasing the memory cell of Flash EEPROM memory arrays. Transistor M5 pulls ROWX negative when ERASEB is set negative. When not erasing, ERASEB is fixed at $V_{DD}$, turning off transistor M5. Diode D3 is a parasitic drain diode between the p-type substrate (backgate terminal BG) and n-type drain region D of n-channel pull-down transistor M3. If the drain of pull-down transistor M3 were connected directly to ROWX, the parasitic diode D3 would prevent ROWX from going more than one diode drop negative (e.g., –0.7V or –0.5V) because it would be forward biased when ROWX goes negative; thus, p-channel isolation transistor M2 isolates ROWX from the cathode of parasitic diode D3 when M5 is bringing ROWX negative to erase the Flash EEPROM. Except when erasing, transistor M2 is held in the on state by applying a negative potential (VNEG) to its gate. During erase, VNEG is set at ground to turn off M2.

If a circuit such as row driver 310 were used with a non-flash memory such as SRAM or DRAM, transistors M5 and M2 are not needed; transistor M5 and the ERASEB signal would be eliminated, the VNEG signal would be eliminated and ROWX would be directly coupled to the drain of pull-down transistor M3.

Pull-up is accomplished by use of (inverse) enable block signal EBKB, which is used to determine which local row along a global row is selected. When the selected GLOBALROWB signal falls low and the selected EBKB signal falls, the associated local row will be pulled high; otherwise it will stay at ground. For a continuous, non-segmented memory array such as memory array 100, block selection transistor M4 may be omitted, and the source terminal S of pull-up transistor M1 coupled directly to $V_{DD}$.

Figure 4B:
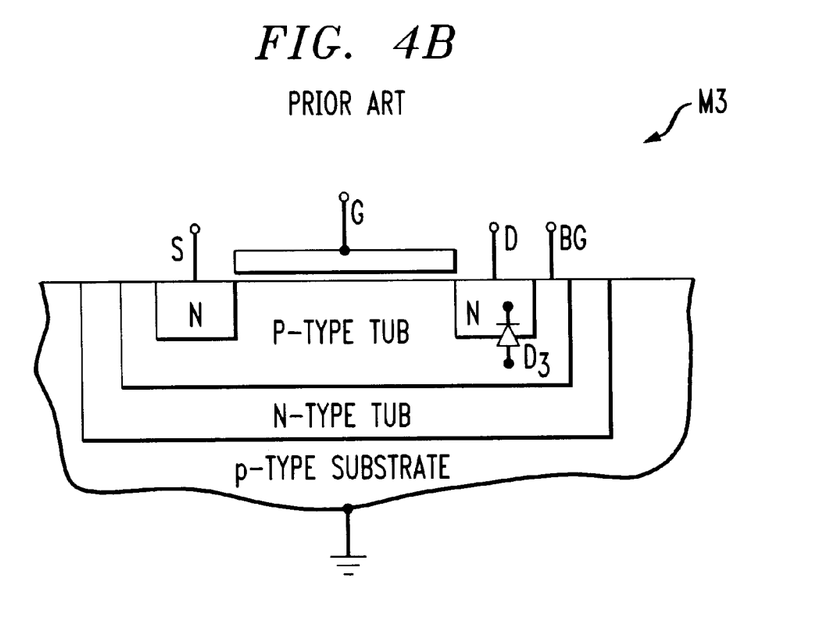

Row driver circuit 350 uses triple-well process n-channel pull-down transistor M3, as illustrated in FIG. 4B. The row output is thus labeled ROWXTW, where "TW" stands for triple well. N-channel pull-down transistor M3 is situated in its own p-well or tub, which in turn is within an n-well or tub, which is itself situated within the p-type substrate silicon wafer. The advantage of using triple-well n-channel transistors such as M3 in row driver 350 is that its backgate connection BG (the p-well) can be lowered below ground potential, in contrast to a non-triple-well n-channel transistor (M3 of circuit 310) which has a backgate terminal fixed at ground along with the substrate.

Because of the triple-well process used for transistor M3 of row driver 350, the anode of a parasitic diode D3 such as illustrated in circuit 310 is not coupled to ground, and thus isolation transistor M2 is not be needed, even if row driver 350 is used with a Flash EEPROM memory. When used as a Flash EEPROM memory row driver, row driver 350 brings ROWXTW negative when the CONTROL signal is set negative. At other times CONTROL is fixed at ground. In memories other than Flash EEPROM, CONTROL is always set at ground.

As for row driver 310, pull-up is accomplished by use of the enable block signal EBKB. As mentioned previously, for a continuous, non-segmented memory array such as memory array 100, block selection transistor M4 may be omitted, and the source terminal S of pull-up transistor M1 coupled directly to $V_{DD}$.

The rate at which a row can be discharged is directly related to the physical size of the pull-down transistors M3. Each row driver 310, 350, therefore, uses a relatively large CMOS n-channel pull-down transistors M3, so that the row driver is powerful enough to quickly lower the row voltage (discharge the row) despite the row capacitance. The use of a large pull-down transistor, however, undesirably increases circuit area and also increase the gate capacitance of the row driver circuit. The row driver is itself driven by circuitry providing the row control signal. Thus, although a larger pull-down transistor M3 helps to discharge the row line more rapidly, the relatively large gate capacitance of the row driver tends to limit cycle time because it slows down how quickly the row control signal can cause the row driver to respond to that signal. If a smaller pull-down transistor M3 is utilized, less area is required and the gate capacitance is decreased, but the row pull-down operation takes longer.

SUMMARY

An integrated circuit memory array has a plurality of rows of memory cells, each row of memory cells being coupled to a respective row line for enabling the memory cells of the row. A row driver of the memory array provides a row voltage on the row line. A pull-up transistor of the row driver pulls up the row voltage in response to a row control signal. A parasitic diode of the pull-up transistor is coupled at its anode to the row line and is adapted to pull the row voltage down from a high state voltage to a diode drop voltage plus a low state voltage in response an enable block signal coupled to the cathode of the parasitic diode. A pull-down transistor of the row driver also pulls down the row voltage in response to the row control signal.

DESCRIPTION OF THE PREFERRED EMBODIMENT

Figure 5A:
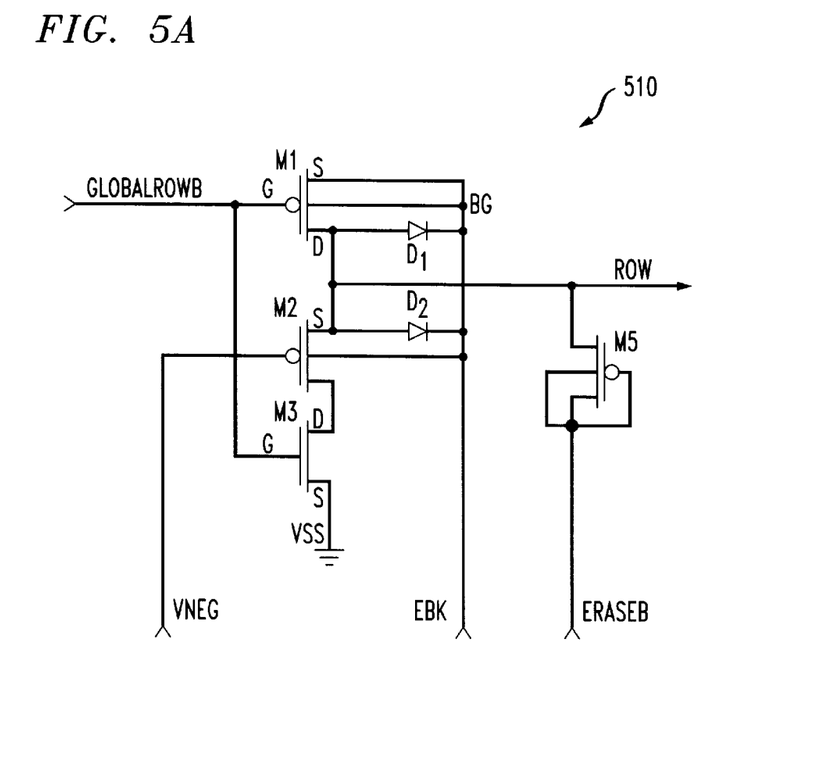
FIGS. 5A,B, are circuit diagrams illustrating two row driver circuits, respectively, in accordance with an embodiment of the present invention.
Figure 5B:
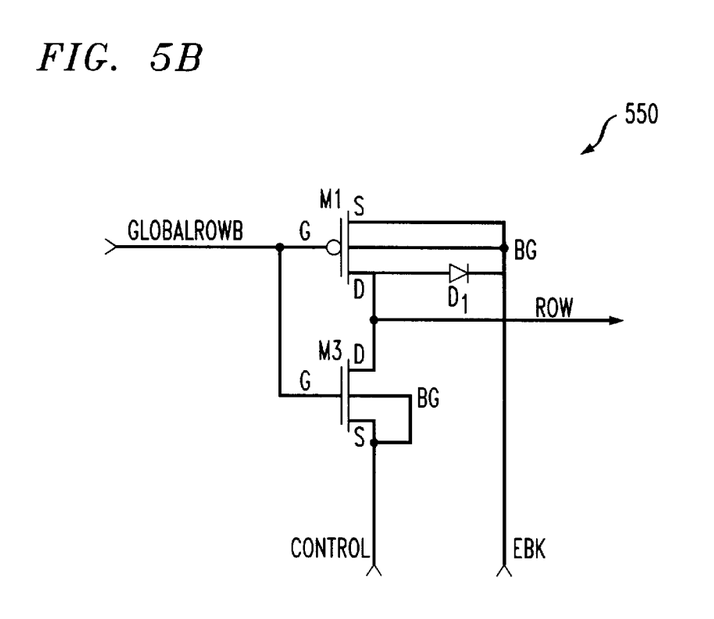
Figure 6:
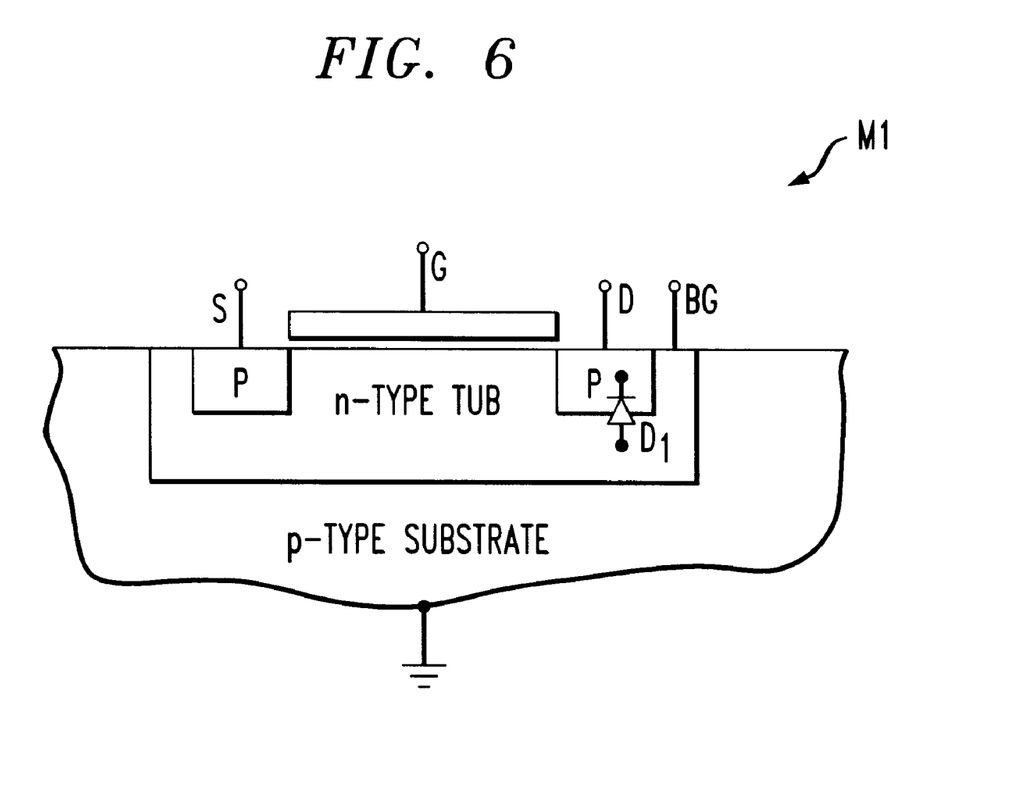
FIG. 6 is a cross-sectional view illustrating the terminals, parasitic diode, and substrate of the p-channel pull-up transistor of the row drivers of FIGS. 5A,B.

Referring now to FIGS. 5A,B, there are shown circuit diagrams illustrating row driver circuits 510, 550, respectively, in accordance with an embodiment of the present invention. Each of the row driver circuits may be used to drive memory cells of continuous or segmented memory arrays, such as arrays 100 or 200. Referring now to FIG. 6, there is shown a cross-sectional view illustrating the terminals (S, G, D, BG), parasitic diode $D_1$, and substrate of the p-channel pull-up transistor M1 of row drivers 510, 550 of FIGS. 5A,B. Parasitic drain to n-well diode $D_1$ is formed at the junction between the p-channel of the drain region and the n-well coupled to the BG terminal, as illustrated. Because transistor M1 is a p-channel transistor, a triple-well process is not required to isolate the BG terminal from the p-type substrate.

Referring once more to FIGS. 5A,B, in row drivers 510, 550, block select transistor M4 is omitted altogether, and the parasitic drain to n-well diode $D_1$ of the p-channel pull-up transistor M1 is used to perform the primary row pull-down function, instead of the n-channel pull-down transistor M3. The n-channel pull-down transistor M3 serves only a supplemental pull-down completion role. Thus, the size of the supplemental pull-down transistor M3 can be smaller than that used in prior art row drivers, while achieving the same or better pull-down speed, and/or increased pull-down speed performance can be achieved for the same size pull-down transistor. This leads to decreased cycle time as well as reduced IC fabrication costs due to smaller row driver size.

In addition, the parasitic diode $D_1$ does not add any extra area to the IC layout, since it is already inherently present in p-channel pull-up transistor M1, and the block select transistor M4 can also be omitted, thus saving more area. Accordingly, a much smaller size row driver circuit can be implemented in an IC without sacrificing row pull-down performance. In addition, reducing the size of the row pull-down transistor M1 reduces the overall gate capacitance of the row driver, therefore improving both pull-up and pull-down performance in response to the row control signal. The row control signal may be a global row control signal applied to several row drivers, each of which provides the row driver signal for the memory cells of a local row of the global row. The row control signal may also be a row control signal applied to a single row driver which drives each memory cell of the entire row. Thus, the term "row" may be used to describe, in general, a plurality of memory cells, either of an entire row or of a local row of a global row, which are driven by a row driver signal from a row driver which receives the row control signal for that row.

Referring once more to FIGS. 5A, row driver circuit 510 omits block select transistor M4 and instead couples the source terminal S and backgate terminal BG directly to the EBK (enable block signal) line, instead of coupling terminals S and BG to transistor M4 and $V_{DD}$, respectively, as is done in prior art row driver 310. In prior art row driver 310, there is a parasitic drain to n-well diode in p-channel pull-up transistor M1, but it is always reverse biased because the backgate terminal BG, which is also the cathode of the parasitic diode, is coupled to $V_{DD}$. Thus, the parasitic diode of the pull-up transistor of row drivers 310, 350 has no effect during the operation of the row driver.

In row drivers 510, 550, by contrast, backgate terminal BG and thus the cathode of parasitic diode $D_1$ is coupled directly to the enable block signal EBK. The drain terminal D and thus the anode of parasitic diode $D_1$ are coupled to the row line labeled ROW. Thus, when the row line needs to be pulled low, the anode of parasitic diode $D_1$ is already at a high state. The enable block signal EBK switches to low and the row control signal GLOBALROWB switches to high. Thus, at this point, the anode of parasitic diode $D_1$ is high (since the row line is high), and the cathode is low (since EBK is low). This forward biases diode $D_1$ which causes the row line ROW to quickly discharge to low plus the diode drop voltage (i.e., approximately 0.5–0.7V), and thus to be pulled most of the way down. That is, row line ROW is pulled down from a high state voltage to the low state voltage plus the diode drop voltage. Since the low state voltage is typically zero or ground, the row line is pulled down from the high state voltage of 3V to the diode drop voltage of 0.5–07.V.

Supplemental pull-down transistor M3 completes the row pull-down by pulling it down from the parasitic diode drop voltage to 0V or low. However, at the diode drop voltage, the row has already disabled the memory cells to which it is coupled and thus the completion need not be done very quickly. Thus, supplemental pull-down transistor M3 need not be as large as pull-down transistor M3 of prior art row drivers 310, 350, because it need not have as much gain. Alternatively, if M3 is not reduced in size, because of the pull-down assist of diode $D_1$, the pull-down of row drivers 510, 550 can be much faster than in previous row drivers. Supplemental pull-down transistor M3 also serves to keep the deselected rows of the memory array at ground when accessing selected rows.

As explained above with respect to prior art circuits 310, 350, row drivers 510, 550 as illustrated are configured for use with Flash EEPROM memory cells. In this configuration, the isolation transistor M2 has a parasitic source to n-well diode $D_2$, which is also forward biased similarly to diode $D_1$, and thus contributes to the pull-down function of parasitic diode $D_1$. If, in an alternative embodiment, row driver 510 is used with a non-flash memory such as SRAM or DRAM, transistors M5 and M2 are not needed; transistor M5 and the ERASEB signal are omitted, transistor M2 is omitted, the VNEG signal is omitted, and ROW is directly coupled to the drain D of pull-down transistor M3. In this case, there is no second parasitic diode $D_2$ to assist the pull-down function of parasitic diode D1.

When row driver 550 is used as a Flash EEPROM memory row driver, row driver 550 brings ROW negative when the CONTROL signal is set negative. At all other times, CONTROL is fixed at ground. When row driver 550 is used in memories other than Flash EEPROM, CONTROL is always set at ground.

As described above, row driver circuits 510, 550 are suitable for use in a segmented memory array such as segmented memory array 200, which utilizes the EBK signal in addition to the row control signal. In an alternative embodiment, the row driver circuits of the present invention may be used with a continuous, non-segmented memory array such as memory array 100. In this case, a signal similar to the enable block signal EBK is employed, except the EBK signal enables the entire row instead of a sub-row. In either embodiment, a row control signal and an enable signal are received which are coupled to the GLOBALROWB and EBK terminal lines of row driver circuits 510, 550.

In an alternative embodiment, pull-down transistor may be omitted altogether, with the parasitic diode $D_1$ of pull-up transistor M1 performing the entire pull-down function. In this embodiment, a single pull-up transistor M1 therefore also performs the pull-down function with its parasitic diode. In another alternative embodiment, a parasitic diode of pull-down transistor M3 is used to perform some or all of the pull-up function.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. An integrated circuit having a memory array comprising a plurality of rows of memory cells, each row of memory cells being coupled to a respective row line for enabling the memory cells of the row, the row line having a row voltage provided by a row driver, the row driver comprising a pull-up transistor for pulling up the row voltage in response to a row control signal, the pull-up transistor comprising a parasitic diode coupled at its anode to the row line and being adapted to pull the row voltage down from a high state voltage to a diode drop voltage plus a low state voltage in response to an enable block signal coupled to the cathode of the parasitic diode.

2. The integrated circuit of claim 1, the row driver further comprising a pull-down transistor for pulling down the row voltage in response to the row control signal.

3. The integrated circuit of claim 2, wherein the pull-down transistor is for pulling down the row voltage from the diode drop voltage plus the low state voltage to the low state voltage to complete the pull-down of the row voltage.

4. The integrated circuit of claim 2, wherein the pull-up transistor is a p-channel pull-up transistor and the pull-down transistor is an n-channel pull-down transistor.

5. The integrated circuit of claim 4, wherein the parasitic diode is a parasitic drain to n-well diode of the pull-up transistor, the parasitic diode being coupled at its anode to a drain terminal of the pull-up transistor and at its cathode to a backgate terminal of the transistor.

6. The integrated circuit of claim 5, wherein:
the memory array is a segmented memory array in which each of the plurality of rows is a local row of a larger, global row;
the drain terminal of the pull-up transistor is coupled to the row line;
the row control signal is coupled to a gate terminal of the pull-up transistor and is an active low row control signal for the global row which switches to high when the memory cells of the row are to be disabled by pulling the row voltage down;
the pull-up transistor is coupled at a junction of a source terminal and the backgate terminal to an active-high enable block signal which switches to low when the memory cells of the row are to be disabled.

7. The integrated circuit of claim 6, wherein:
a drain terminal of the pull-down transistor is coupled to the row line;
a gate terminal of the pull-down transistor is coupled to the row control signal; and
a source terminal of the pull-down transistor is coupled to a low signal during row voltage pull-down.

8. The integrated circuit of claim 1, wherein the pull-up transistor is a p-channel pull-up transistor.

9. The integrated circuit of claim 1, wherein the memory array is a segmented memory array in which each of the plurality of rows is a local row of a larger, global row.

10. The integrated circuit of claim 1, wherein the enable block signal causes the parasitic diode to pull the row voltage down from the high state voltage to the diode drop voltage plus the low state voltage when the row control signal is not causing the pull-up transistor to pull up the row voltage.

11. In a integrated circuit having a memory cell array comprising a row driver having a pull-up transistor and a pull-down transistor, wherein the row driver is for driving a row voltage of a row of memory cells of the memory cell array, a method comprising the steps of:

(a) pulling the row voltage up to a high state voltage with the pull-up transistor in response to a row control signal;

(b) pulling the row voltage down from the high state voltage to a diode drop voltage plus a low state voltage with a parasitic diode of the pull-up transistor, coupled at its anode to the row line, in response to an enable block signal coupled to its cathode; and (c) pulling the row voltage down to the low state voltage with the pull-down transistor in response to the row control signal.

12. The method of claim 11, wherein step (c) comprises the step of pulling, with the pull-down transistor, the row voltage down from the diode drop voltage plus the low state voltage to the low state voltage to complete the pull-down of the row voltage.

13. The method of claim 11, wherein the pull-up transistor is a p-channel pull-up transistor and the pull-down transistor is an n-channel pull-down transistor.

14. The method of claim 13, wherein the parasitic diode is a parasitic drain to n-well diode of the pull-up transistor, the parasitic diode being coupled at its anode to a drain terminal of the pull-up transistor and at its cathode to a backgate terminal of the transistor.

15. The method of claim 14, wherein:
the memory array is a segmented memory array in which each of the plurality of rows is a local row of a larger, global row;
the drain terminal of the pull-up transistor is coupled to the row line;
the row control signal is coupled to a gate terminal of the pull-up transistor and is an active low row control signal for the global row which switches to high when the memory cells of the row are to be disabled by pulling the row voltage down;
the pull-up transistor is coupled at a junction of a source terminal and the backgate terminal to an active-high enable block signal which switches to low when the memory cells of the row are to be disabled.

16. The method of claim 15, wherein:
a drain terminal of the pull-down transistor is coupled to the row line;
a gate terminal of the pull-down transistor is coupled to the row control signal; and
a source terminal of the pull-down transistor is coupled to a low signal during row voltage pull-down.

17. The method of claim 11, wherein the memory array is a segmented memory array in which each of the plurality of rows is a local row of a larger, global row.

18. The method of claim 11, wherein the enable block signal causes the parasitic diode to pull the row voltage down from the high state voltage to the diode drop voltage plus the low state voltage when the row control signal is not causing the pull-up transistor to pull up the row voltage.

* * * * *